United States Patent [19]

Angelotti et al.

[11] Patent Number: 5,617,430
[45] Date of Patent: Apr. 1, 1997

[54] TESTING SYSTEM INTERCONNECTIONS USING DYNAMIC CONFIGURATION AND TEST GENERATION

[75] Inventors: Frank W. Angelotti; Wayne A. Britson; Steven M. Douskey; Kerry T. Kaliszewski, all of Rochester; Michael A. Weed, Spring Valley, all of Minn.

[73] Assignee: International Business Machines Corporation, Armonk, N.Y.

[21] Appl. No.: 171,492

[22] Filed: Dec. 22, 1993

(Under 37 CFR 1.47)

[51] Int. Cl.⁶ .................................................. G01R 31/28
[52] U.S. Cl. ........................... 371/27; 364/578; 364/580; 371/22.3
[58] Field of Search .................................... 364/578, 580; 371/15.1, 22.3, 27, 29.1

[56] References Cited

U.S. PATENT DOCUMENTS

| | | | |
|---|---|---|---|
| 4,025,906 | 5/1977 | Riikonen | 395/275 |
| 4,604,744 | 8/1986 | Littlebury et al. | 371/27 X |
| 4,606,024 | 8/1986 | Glass et al. | 371/16.1 |
| 4,710,931 | 12/1987 | Bellay et al. | 371/22.3 |
| 5,056,093 | 10/1991 | Whetsel | 371/22.3 |
| 5,325,368 | 6/1994 | James et al. | 371/22.3 |
| 5,343,478 | 8/1994 | James et al. | 371/22.3 |
| 5,369,604 | 11/1994 | Ravindranath et al. | 364/580 |
| 5,390,351 | 2/1995 | Di Giulio et al. | 395/725 |
| 5,414,715 | 5/1995 | Hamblin et al. | 371/27 X |

OTHER PUBLICATIONS

F. W. Angelotti et al, "System Level Interconnect Test In A Tristate Environment", 1993 IEEE, International Test Conference 1993, pp. 45–53.

IEEE Computer Society, "IEEE Standard Test Access Port and Boundary–Scan Architecture", Oct. 1993.

C. M. Maunder et al, "The Test Access Port And Boundary–Scan Architecture", IEEE Computer Society Press Tutorial 1990.

Primary Examiner—Edward R. Cosimano
Attorney, Agent, or Firm—J. Michael Anglin; Karuna Ojanen

[57] ABSTRACT

An electronics systems having variable interconnections among major components is tested by dynamically identifying the locations and types of all system components at the time the test is to be performed, for building a global model describing the interconnections among these components. Specific tests appropriate for this model are then dynamically generated and executed. Data on the components themselves identifies them. The tests employ boundary-scanning techniques to locate failing drivers, receivers, and bidirectional driver/receivers, as well as open and shorted interconnections.

19 Claims, 7 Drawing Sheets

TESTING SYSTEM INTERCONNECTIONS USING DYNAMIC CONFIGURATION AND TEST GENERATION

BACKGROUND OF THE INVENTION

The present invention concerns the testing of electronics systems, and specifically relates to testing interconnections among system components which may vary from one system to another, and from time to time within a single system.

Many electronics systems are constructed as a number of components or subassemblies electrically coupled together by socketed cables, backplane buses, or other means which allow the components to be moved, added, and replaced within the system. Digital computers in particular typically comprise a number of cards, boards, or books which perform major functions of the system, and which plug into a number of bus slots whose sockets contain signal buses, power distribution, and other wiring for connecting the functional cards to each other. Individual cards for a computer system often include several types of processor, different sizes of memory, and a large number of general and specialized input/output adapters for external storage devices, display terminals, and so forth. Many cards of a single type also commonly have in different models and engineering-change levels.

A computer or other system of this type may be easily customized to hundreds or thousands of different configurations to meet the needs of different users and to upgrade capabilities. But this flexibility has its disadvantages as well. Connectors such as those used between major system components are among the most failure-prone of electrical elements. Cables, wiring harnesses, and even printed-circuit wiring are also among the least reliable elements in modern electronics systems, and are often subject to mechanical stresses, environmental deterioration, and other wear mechanisms to a greater extent than other electrical elements.

Techniques exist for testing the smaller parts of complex systems, such as integrated circuits, modules, and even printed-circuit cards and other subsystems. One group of techniques in particular has been employed for a long time for testing integrated circuits. Called "level-sensitive scan design" (LSSD), "boundary scanning", and "STUMPS", these techniques employ banks of digital registers to store nominal data signals during operation of the system. In a selectable test mode, however, the register banks are electrically switched to form a single very long shift register. Test equipment shifts a string of bits forming a test vector into this chain of registers. Special clock signals apply these bits to inputs of the logic circuits or nets on the chip, and then receive the response bits output from the nets. This result vector is then shifted back into the test equipment for comparison with a vector of expected result bits.

These and similar techniques have been expanded to test larger components and subassemblies, such as multi-chip modules and even entire printed-circuit cards. But tests of the more failure-prone parts of large systems, the system interconnects between major components, has heretofore not been practical. The testing of entire systems is still practical only at the manufacturing stage, and even then requires expensive specialized test equipment. Many systems cannot be fully tested in the field during normal operation, or when a customer or service representative modifies them.

Conventional boundary scanning and similar test methodologies are not feasible for testing overall system interconnections, because such interconnections vary from one system to another and over time within a single System. These methodologies require advance knowledge of the wiring topology of the system in order to produce the correct test vectors and comparison data for the result vectors. Although it is theoretically possible to store data for every potential system configuration, even a relatively small midrange computer has hundreds or thousands of possible configurations, which would require impractically large amounts of storage. Also, of course, the system or test equipment would have to be able to determine in some way which of these myriad configurations actually exists in the system at the time the test is performed.

At the present time, then, there is no practical way to test the variable system-level interconnections among major components of a system which allows such components to be added, changed, and removed.

SUMMARY OF THE INVENTION

The present invention provides apparatus and methods for testing the interconnections or nets at the system level, among components or subassemblies without requiting any fixed knowledge of the configuration of the system, and without requiring the storage of huge amounts of information concerning the possible locations and types of system components.

The invention allows the overall testing of large electronics systems in the field, even during routine operation, such as at every power-up or initial program load. It permits overall interconnect testing on the manufacturing floor when a system is first configured, without requiring specialized equipment. In many cases, no external test equipment is needed at all; the invention employs elements which are already present for other purposes. Thus, the invention also reduces testing cost and time.

The invention adapts testing techniques heretofore applicable only to fixed topologies to variable configurations which cannot feasibly be determined at the time of system design.

Broadly, the present invention first dynamically identifies the locations and types of all system components at the time the test is to be performed, and builds a global model of the system. It then dynamically generates specific tests appropriate for this model, and executes them. Finally, it reports deviations from expected results.

More particularly, the test apparatus—which may form a part of the system itself—uses data already stored in the components to identify them. The tester accesses a small number of prestored tables describing possible component types and builds a table of nets specifying the actual interconnections of the components which exist in the particular system under test. These wiring nets are then tested as "logic circuits" using extensions to the above-described scanning techniques; in effect, the scan registers already on the chips within the components are turned inside out, so as to test the wiring outside the chips, rather than the logic circuits within the chips. The tests detect open circuits in the interconnect wires and short circuits between wires; they also detect drivers and receivers which have become stuck at either logic level.

DESCRIPTION OF A PREFERRED EMBODIMENT

Figure 1:
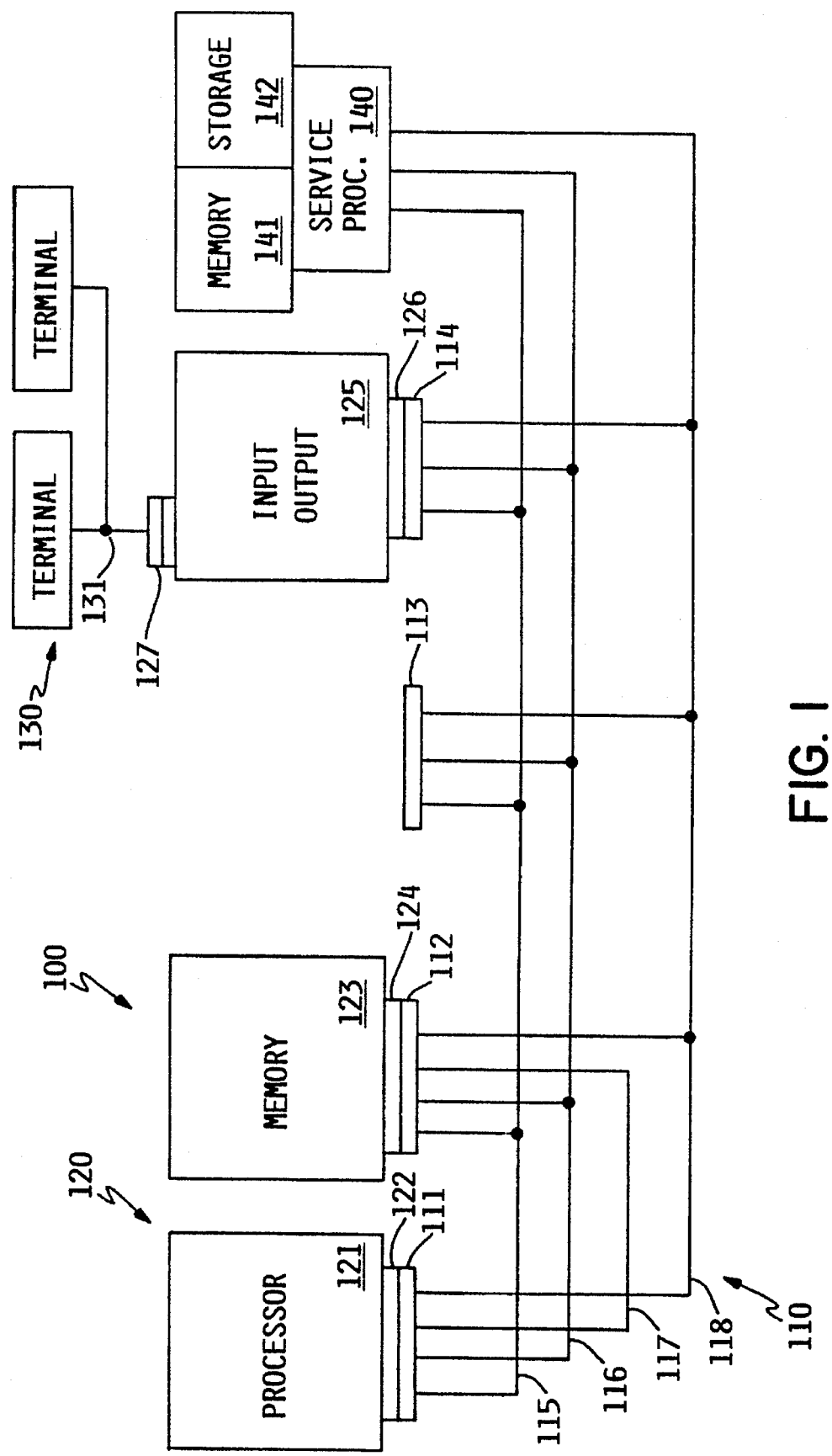
FIG. 1 is a high-level diagram of a digital computer system in which the invention finds utility.

FIG. 1 is a high-level schematic diagram of a computer system 100 incorporating the invention. By way of illustration, system 100 may be an IBM AS/400 (R) computer. A system interconnect structure 110 provides electronic interconnections between system components 120. System components typically plug into a number of connectors or sockets 111–114. A large number of individual functional wires or groups of wires such as 115–117 interconnect the components for performing normal system functions. Some of the wires, e.g. 117, may connect less than all of the components. Bus wires 118 are used for testing, although they may also carry clocking signals used for normal operation as well. For this reason, certain sockets may be dedicated to certain types of functions. For example, only a processor component may be plugged into socket 111, only a memory component fits into sockets 112, and so on. System interconnect structure 110 may be implemented as a collection of cables and plugs, as a socketed backplane board, or in other conventional ways; its significant characteristic is that the type, number, and location of system components which it connects may vary from system to system, and also from time to time within a single system.

Individual system components 120 plug into sockets 111–114 to provide the major functions of system 100. A system component could be a single chip or a multi-chip module, but a common system component is a printed-circuit card, with or without a protective cover, which contains a number of integrated-circuit chips to provide a complete function of the system. For example, processor card 121 contains chips 210–230 which are interconnected by printed wiring to each other and to a connector 122. Different types of cards interface to the bus in different ways; that is, different card types connect differently to bus wiring 110. Some cards use wires, such as 117 above, which are not used by other card types, and certain card types use the same wiring but in different ways—for example, a processor card drives signals onto memory lines, while memory and peripheral components may only receive signals on these lines. Connector 122 allows card 121 to be removably inserted in socket 111. Memory card 123 holds memory and logic chips for storing data; printed wiring connects these chips to each other and to memory-card plug 124. The memory card is removably inserted into socket 112. No Card is plugged into socket 113, in this example system. An input/output processor (IOP) card or book 125 provides conventional functions such as communications, disk-storage control, workstation control, or local-area network attachment. Card wiring couples the chips on this card to each other and to connector 126. This connector releasably connects the card to socket 114. Additionally, connector 127 may connect the card wiring to an external device such as a disk drive or a group of workstations or terminals 130 by a cable 131.

System components 120 may assume different implementations, as long as system 100 can be varied or customized by removably inserting different components into the sockets 111–114 for the purpose of reconfiguring and upgrading the system. In some systems, any type of component may be plugged into any socket on the bus 110. In the example shown in FIG. 1, socket 111 is reserved for one of a number of available processor cards, socket 112 for one of a number of memory cards, and sockets 113–114 for any of a number of different types of IOP cards; some or all of these cards may also exist at different engineering-change levels. For this reason, the wiring 115–118 differs among the different sockets 111–114.

System 100 also includes a service processor 140, its associated program and data memory 141 and a secondary storage device 142 used for storing service processor programs and data. In this embodiment, processor 140 controls certain overall system functions, such as loading microcode into processor 121, performing system diagnostics upon power-up (IPL), and managing operator display panels. The service processor is coupled to bus 110 via some or all of the functional bus wiring 115–117; it also controls wiring 118, which is dedicated to test purposes. It may be hard-wired into the system as shown in FIG. 1, or it may be removably connected to a socket and connector. In this implementation, service processor 140 directs the performance of the tests according to the invention, using programs and data stored in ROM and RAM memory chips 141 and read in from secondary storage device 142; alternatively, some other mechanism, such as an external tester or system, or even one of the system components itself, could perform these tests.

Figure 2:
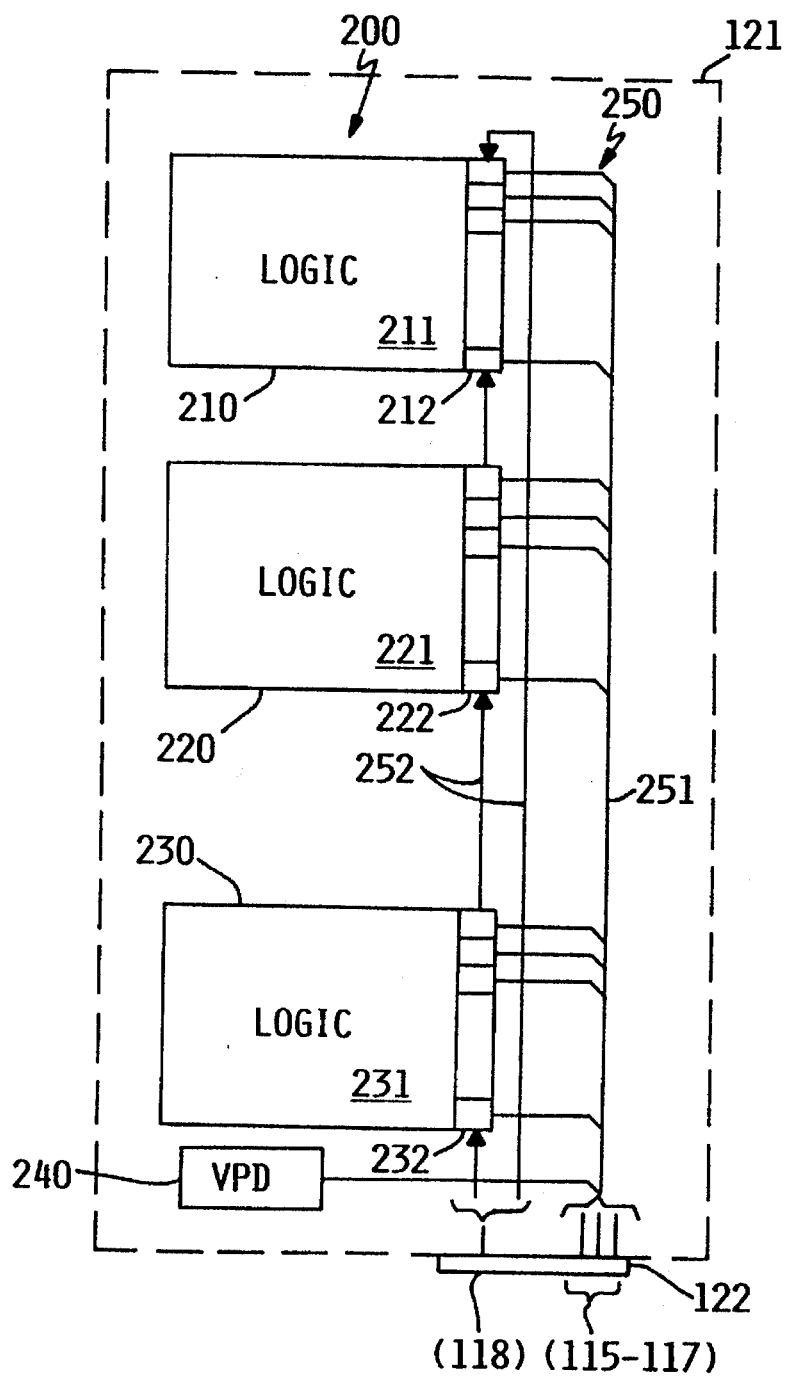
FIG. 2 shows greater detail of a representative card in the system of FIG. 1.

FIG. 2 shows components 200 of a representative card from system 100, FIG. 1. Processor card 121, FIG. 1, is used as an example; all cards 121–125 are similar in the particulars relevant to the present invention.

Components 200 include a number of integrated-circuit chips such as 210, 220, 230 having internal logic circuits 211, 221, 231 and off-chip register units 212, 222, 232. Wiring 250 on the card interconnects chips 210, 220, 230 by routing a number of different kinds of signals among register units 212, 222, 232, and also couples these signals to other cards via connector 122, as previously described. In system 100, every card also includes a conventional mechanism such as a read-only memory (ROM) unit 240 for storing "vital product data" (VPD). This vital product data identifies various characteristics of the card, including its type and engineering-change level. The service processor 140 shown in FIG. 1 can address and read the vital product data of each card.

Internal buses 251 of card wiring 250 transport conventional data, address, and control signals among chips 210, 220, 230 and ROM 240, and to/from connector 122; these buses couple to backplane bus lines 115, 116, 117, FIG. 1. Test-mode wiring 252 carries signals which switch between a test mode and a normal mode, introduce test-mode scan clocks and a receive clock, for sampling test data into the latches, into register units 212, 222, 232 in the test mode, enable and disable driver circuits in these units, can), serial test data into these units from connector 122, and carry serial test results from these units back to connector 122. In this implementation, as a matter of convenience, wiring 252 also carries the normal-mode clock signals to all the chips on the card.

Figure 3:
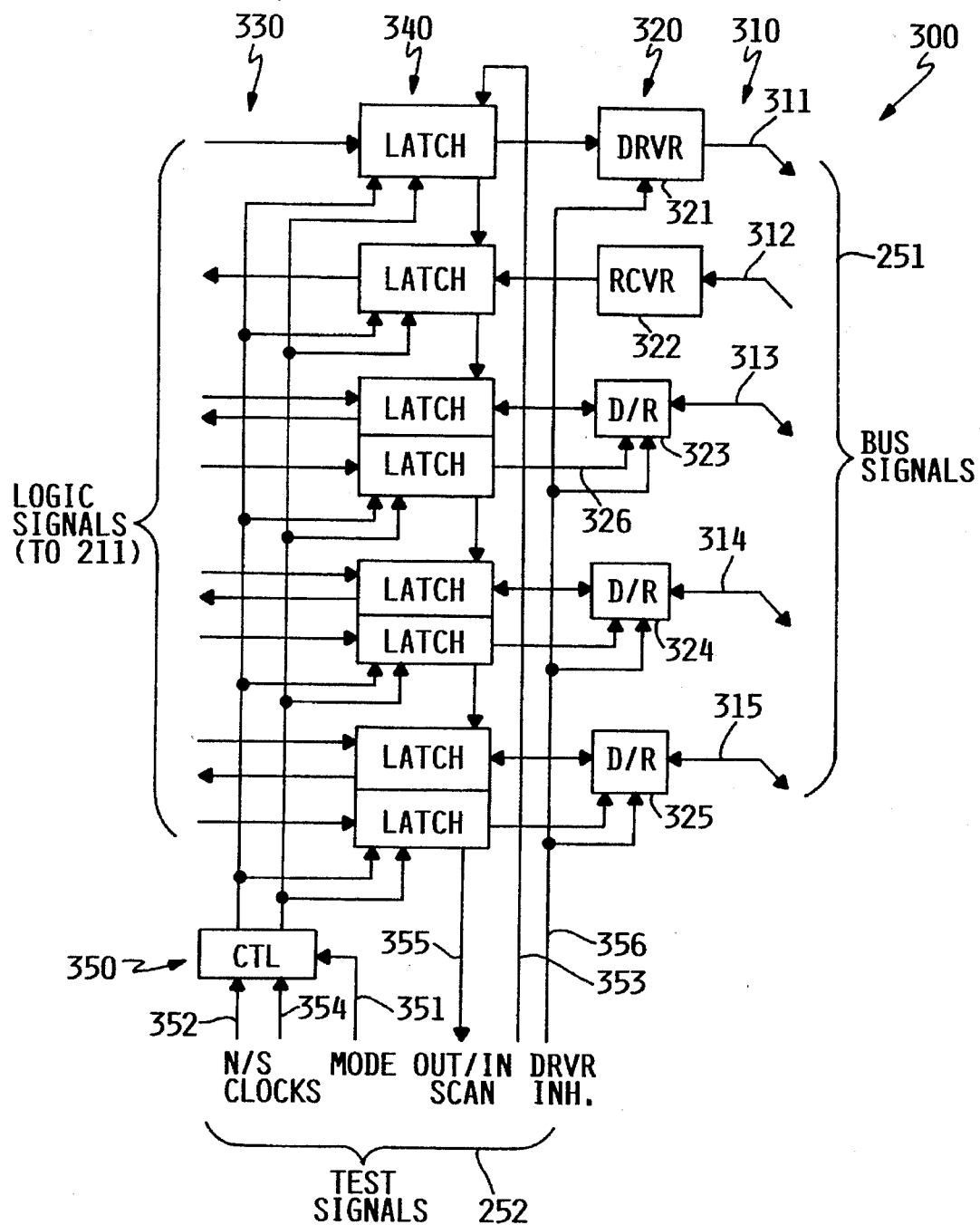
FIG. 3 shows the details of a scan ring in one integrated-circuit chip of the card of FIG. 2.

FIG. 3 shows components 300 of a representative register unit such as 212, FIG. 2. Off-chip signal lines 310 may be transmit-only, such as line 311 extending from driver circuit 321, receive-only, as line 312 from receiver circuit 322, or bidirectional, as lines 313, 314, 315. These lines connect to card wiring 251, FIG. 2. Driver/receiver circuits 320 boost the levels of these signals in a conventional manner. A bidirectional or common-input-output (CIO) driver such as 323, 324, or 325 has a separate control line 326 for switching between transmit and receive modes. This control line is driven from a boundary scan latch that is part of that CIO. Hence the drive/receive state of CIOs can be controlled by scanning in the test mode, as well as by logic circuits 211 in the normal mode. Logic lines 330 couple logic circuits 211, FIG. 2, to the boosted off-chip lines 310; circuits 211 perform the normal functions of system 100.

Referring to FIGS. 1, 2, and 3 together, when the system is in its normal mode, mode controller 350 responds to a "normal" level on mode line 351 to couple a normal clock signal 352 in parallel to latches 340. In this mode, latches 340 function as a parallel data register for synchronizing the signals on lines 330 to a bus cycle time. The "test" level of mode signal 351 reconfigures latches 340 into a serial shift register. In this mode, serial test or scan data from scan-in line 353 is shifted through register 340 in response to scan clock signals 354; this scan data may come from service processor 140 over bus lines 118 from the output of another scan register on card 121 or on another card in the system. Scan result line 355 returns data shifted out of latches 340 to test bus 252 for input to another of the scan registers on the same card or on a different card, or for return directly to service processor 140 over bus lines 118. Before shifting data into and out of the boundary-scan latches, service processor 140 activates driver-inhibit line 356 to prevent driving arbitrary logic signals onto bus 251 and thus onto bus 110 as data shifts through the boundary scan latches. After selected serial data values are shifted into the latches, driver-inhibit line 356 is deactivated, allowing drivers 320 to drive values from boundary scan latches 340, whenever their normal enable signals 326, etc., are present. Then, service processor 140 toggles scan-receiver clocks 354 to allow the boundary-scan data to be modified by signals on lines 310. Inhibit line 356 is then raised, and scan clocks 354 shift the modified test data out of the boundary-scan latches as serial data on result line 355.

Latches 340 and controller 350 are of conventional design; they may operate according to a level-sensitive-scan design (LSSD) principle, or in accordance with any one of a number of boundary-scan test designs. A typical CIO boundary scan latch circuit is shown in Angelotti, et al., "System Level Interconnect Test in a Tristate Environment", *IEEE International Test Conference,* 1993, pp.45–53. Conventional boundary-scan components and signals are also shown in "IEEE Standard Test Access Port and Boundary-Scan Architecture", *IEEE Standard* 1149. 1-1990, IEEE Standards Board, May 1990, and in C. M. Maunder et al., *The Test Access Port and Boundary-Scan Architecture,* IEEE Computer Society Press, 1990.

Figure 4:
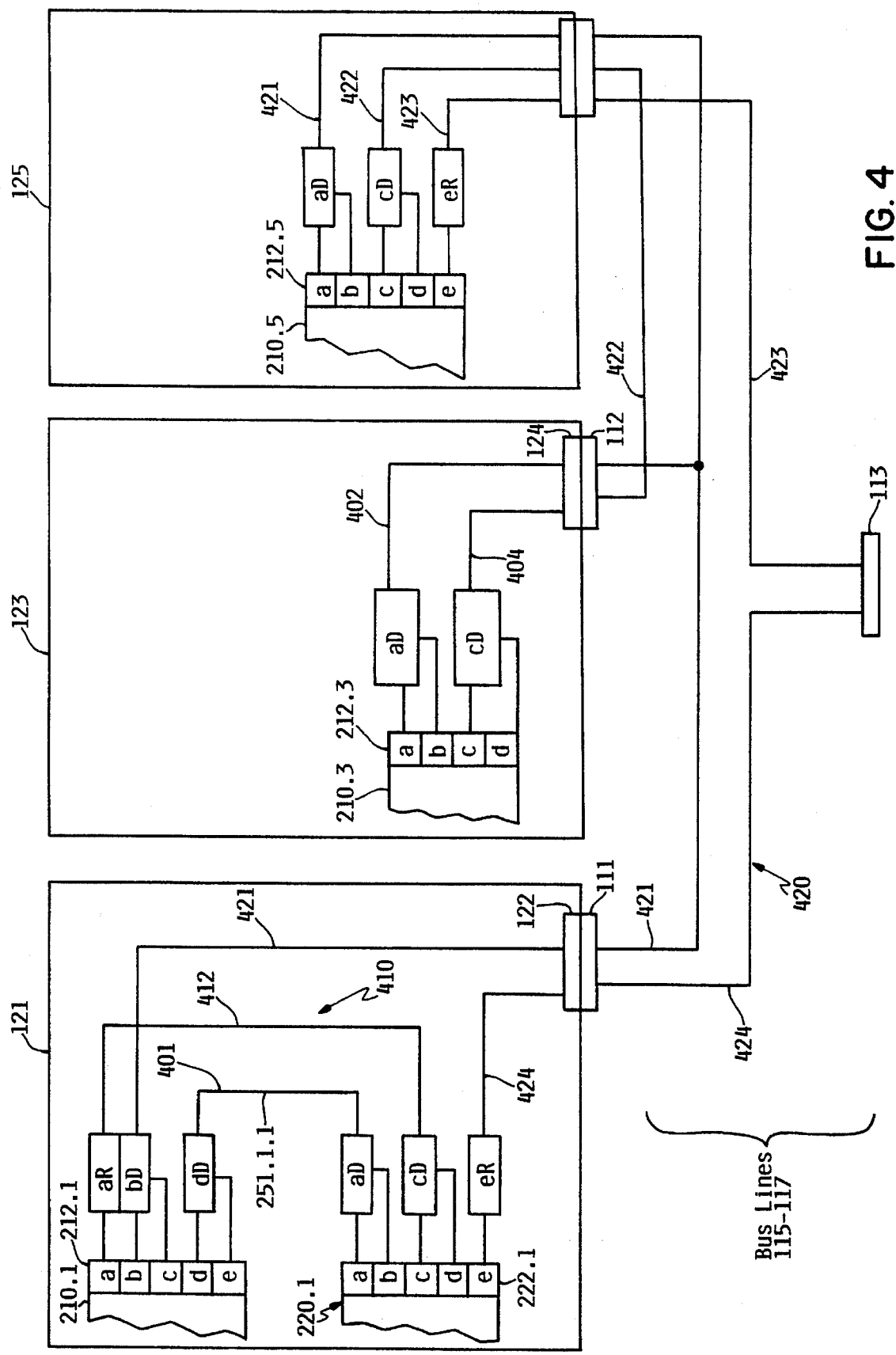
FIG. 4 shows how the system of FIG. 1 is conceptually divided into nets for testing according to the invention.

FIG. 4 shows how the conventional principle of boundary-scan testing of integrated-circuit logic nets is extended in order to dynamically define and test system-wide nets for testing variable interconnections among reconfigurable components in an electronic system, in accordance with the invention. FIG. 4 contains only a few of the elements shown in FIGS. 1–3, in order to illustrate all of a small number of system nets. In effect, FIG. 4 is a partial representation of a complete system, showing the current state of the interconnections among components of system 100. FIG. 4 includes only the nets being tested; it omits the circuitry of FIGS. 1–3 which perform the tests.

On card 121 scan ring register 212.1 has five latches, a b c d e, and associated driver/receivers aR bD and dD; scan ring register 222.1 also has latches a b c d e and associated driver/receivers aD cD and eR. Latch d, connects, through its associated driver/receiver dD, via on-card signal line 251.1.1 to scan register 222.1 and its driver/receiver aD. This connection defines a net 401. Because line 251.1.1 has a CIO driver/receiver at each end, net 401 can carry a signal in either direction in FIG. 4. On latch 212.1, CIO dD controls the send/receive direction on net 401 from chip 210.1. Similarly, latch b of scan register 222.1 provides direction control for CIO aD from chip 220.1. Thus, there are two boundary scan latches for every CIO in a register. The data latch controls the logic value on the net and samples the driven value when boundary-scan receive clocks 354, FIG. 3, cycle. On card 121, latches b and d of scan-ring register 212.1 and latches a and c of scan-ring register 222.1; on card 123, latches c and c of scan-ring register 212.3; and on card 125, latches a and c of scan-ring register 212.5 are all CIO data latches. On card 121, latch a of scan-ring register 212.1 and latch e of scan register 222.1; and on card 125, scan-ring register 212.5, latch e are all data latches for unidirectional signals. Enable latches select between the drive and receive functions of each CIO. In FIG. 4, latches 212.1c, 212.1e, 222.1b, 222.1d, 212.3b, 212.3d, 212.5b, and 212.5d are enable latches for the CIOs directly above them in FIG. 4; that is, the enable signal in a scan ring directly follows the data signal for the same driver, in boundary-scan order.

Multiple enable latches on the same net must never be set simultaneously. For example, on card 121 setting enable latch e of scan-ring register 212.1 and latch b of scan-ring register 222.1 at the same time would cause both of the drivers dD and aD to attempt to drive net 401; this could damage the drivers. To avoid this situation, test pattern generation takes into account the interconnect topology when selecting interconnect tests. Random pattern tests and walking ones/zeros tests should not be employed.

Nets 401 and 412 are on-card nets; that is, they do not extend across connector 122 to another card of system 100. Such nets, designated generally as nets 410, always maintain a fixed configuration within the system, and thus do not require the present invention for effective testing; however, their testing is seamlessly integrated into the invention, as described below. On-card nets have been omitted for the other cards in FIG. 4.

On card 121, latch b of scan-ring register 212.1 connects to CIO driver/receiver bD, which travels through the system interconnect structure to card 123 and its CIO driver/receiver aD and also to card 125 and its CIO driver/receiver aD. This path defines a three-ended off-card or system-level net 421. System-level nets, which connect between system components, are designated generally as nets 420. Such nets cannot be effectively tested without knowledge of the entire system topology. For example, if component 123 is not present in the system, net 421 becomes a two-ended net and requires a different set of test patterns than is required for the situation depicted in FIG. 4. Also, not all IO elements in the system are CIOs. For example, on card 121, scan-ring register 212.1 IO element aR connected to latch 212.1a is a receive-only element, and thus can only receive data from scan-ring register 222.1 transmitted by driver cD, which is driven from latch c. Net 412 can only drive data from latch c of scan-ring register 222.1 on chip 220.1 to latch a of scan-ring register 212.1 on chip 210.1. Since a unidirectional receiver does not require a separate control signal, only one boundary scan latch is connected to it. A similar situation exists with a drive-only IO element. On card 125 of scan-ring register 212.5 latch e is connected to drive-only element eD through net 423 to unoccupied slot 113. This net can be tested in a limited manner in this configuration because boundary-scan data latches sample the value driven on the net even when they correspond to the CIO that drives the net. Net 424 also connects to unoccupied slot 113. However, this net cannot be tested, because IO element eR of card 121, scan-ring register 222.1 can only receive a data signal. If no DO or CIO element is connected to net 424, there is no way to force a given logic level on net 424, so the value that will be sampled in latch e is undetermined. Although net 424 will not be tested, the currently existing system configuration does not use this net; therefore, no system malfunction will result if that net is bad.

Whereas conventional boundary-scan testing can be used to check for the proper functioning of logic nets that do not leave system components, e.g., nets 410, the purpose of the present method is to extend such testing to nets that interconnect multiple system components, e.g., nets 420. This allows the checking of nets that traverse removable connectors, even though the topology of these nets might not vary from one system to another and from time to time even within the same system. Such removable connectors are notoriously unreliable and tend to maintain a significant failure rate over the entire life of a system, whereas integrated circuits and on-card connections tend to have a large infant mortality followed by relatively high reliability thereafter. The present testing method also allows for the testing of IO elements and boundary-scan latches on nets 420 that cannot be tested by conventional means.

Figure 5:
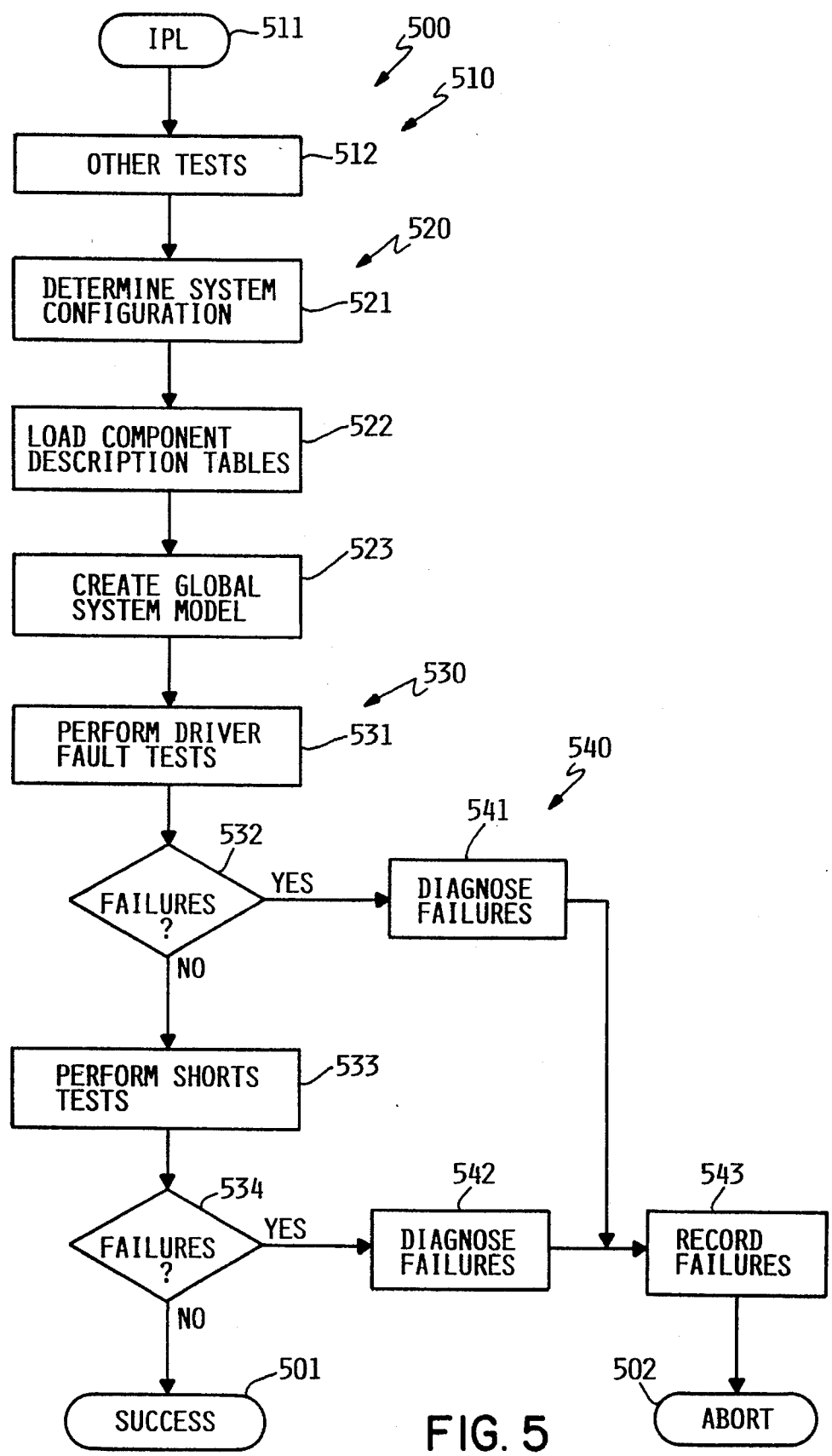
FIG. 5 is a flowchart of a test procedure according to the invention and executing within the system of FIG. 1.

FIG. 5 is a flowchart showing an overall testing procedure 500 according to the invention. This procedure is preferably implemented as a program executing in service processor 140 and stored in memory 141 of system 100, FIG. 1. Steps 510 precede the actual test. Step 511 starts the procedure at initial program load (IPL) of system 100. Procedure 500 might also start at other times, such as system power-on, certain clock times or system running hours, or upon an error indication. Step 512 executes conventional routines unrelated to the invention, such as initialization and infrastructure tests.

Steps 520 dynamically specify the tests to be conducted by constructing a global model of system 100. In conventional practice only those nets within a single card or integrated-circuit chip were tested because these nets never change. In the present environment, however, the configuration of system 100 might possibly be different every time it is IPLed. Indeed, a system which allows hot-plugging of components for continuous running might change even more frequently. Thus, steps 520 must be executed whenever the system can be expected to have changed its configuration since the previous test. Step 521 determines exactly what type of system components are connected at all potential component slots. In the present embodiment, service processor 140 reads the VPD from ROM such as 240 present on each system component as shown in FIG. 2. Processor 140 addresses each slot in turn, so that it can identify each VPD with a particular slot or socket 111–114, FIG. 1 on system bus 110. Alternatively, VPD could be read from a central electrically alterable ROM or flash memory that is available in all system configurations, or scanned out from specified positions in internal or boundary-scan latches; each of these approaches has been used on AS/400 systems. The present invention requires VPD information sufficient to identify the component type and engineering-change (EC) level of the component in each component slot. For simplicity, the word "type" alone will signify both type and EC level. An empty slot is denoted by a null VPD value for that slot. The VPD may contain information beyond that required for the present invention, and service processor 140 may read and manipulate VPD information for other purposes as well.

Step 522 accesses service processor secondary storage such as a disk drive or tape drive to load a set of component description (CD) tables for the components actually present in the system, as determined in the preceding step. Tables for each of about a dozen possible individual component or card types are loaded into service-processor memory 141. This small number of tables replaces hundreds or thousands of possible configuration tables which would otherwise be required to represent every possible combination of card types, if the tests were not configured dynamically according to the invention. Additionally, storing component descriptions instead of actual interconnect test patterns saves significant storage space. The table for a particular component type contains a separate entry for each IO element in the register of that component. Each CD table entry has a fields that provide structural and test information about that IO element as illustrated below:

>Raw net number
>IO class
>Test flag
>Constant-value information
>Special translation information
>Fault-tolerant group The CD tables are ordered so that entries follow the sequence in which test data are scanned into latches 340 via serial scan-in line 353, in the circuitry detailed in FIG. 3.

The raw net number designates the particular net that the corresponding IO element connects to. This essentially arbitrary number may be specified by the component manufacturer from design information describing on-chip and on-card boundary-scan registers, and off-card connections to the system. Since the raw net number is generated without knowledge of the current system configuration at the time of a test, it may require translation to a system-level net number. This process will be described below. The IO-class field classifies the current IO element as: bidirectional (CIO), receive-only (RO), or drive-only (DO); additional classes might be included in the future. The test flag identifies certain nets that cannot be tested for various reasons. For instance, nets for development-lab debug purposes should not be tested, because failure of these nets would not affect normal system operation. The constant-value field flags the small minority of nets that could place the system in an illegal state if they were controlled by boundary-scan testing. The constant-value field also contains the bit pattern that must be placed on the boundary-scan data latch for that IO element, and on the enable latch if the element is a CIO.

The special translation information field flags certain nets whose net numbers might need translation, and provides information about how to carry out the translation process. The fault-tolerant group field is not presently used. It could be employed in fault diagnosis to identify nets whose failure can be tolerated because of other error correction in the system. The listing below shows an example of a card description table for the small portion of card 121 which is shown in FIG. 4.

| CHIP Net# | Cl. | Raw Flag | IO Value | Test Constant Trans. | Special Toler. | Fault |
|---|---|---|---|---|---|---|
| 210.1 | | | | | | |
| | 412 | RO | true | false/none | slot | none |
| | 421 | CIO | true | false/none | none | none |
| | 411 | CIO | true | false/none | slot | none |
| 220.1 | | | | | | |
| | 411 | CIO | true | false/none | slot | none |
| | 412 | CIO | true | false/none | slot | none |
| | 424 | RO | true | false/none | none | none |

Step 523 builds a global model (GM) of system 100 from the ordered tables accessed in step 522. The global model specifies all the system interconnections which will be tested, as they exist at the time the test is perforated. FIG. 4 shows a schematic representation of this model. The actual model, as it is used by the invention, is comprised primarily of a GM table that can be indexed by system component (card), boundary-scan register (chip), and latch position. The layout of the GM table is very similar to the CD tables described above. It contains one entry for each boundary-scan register latch in the entire system (as opposed to one entry for each IO element in the CD tables). Each entry contains:

>System level net number

>Class of latch (RO data, DO data, CIO data, CIO enable)

>Constant value for the latch

>(potentially) fault tolerance

Figure 6:
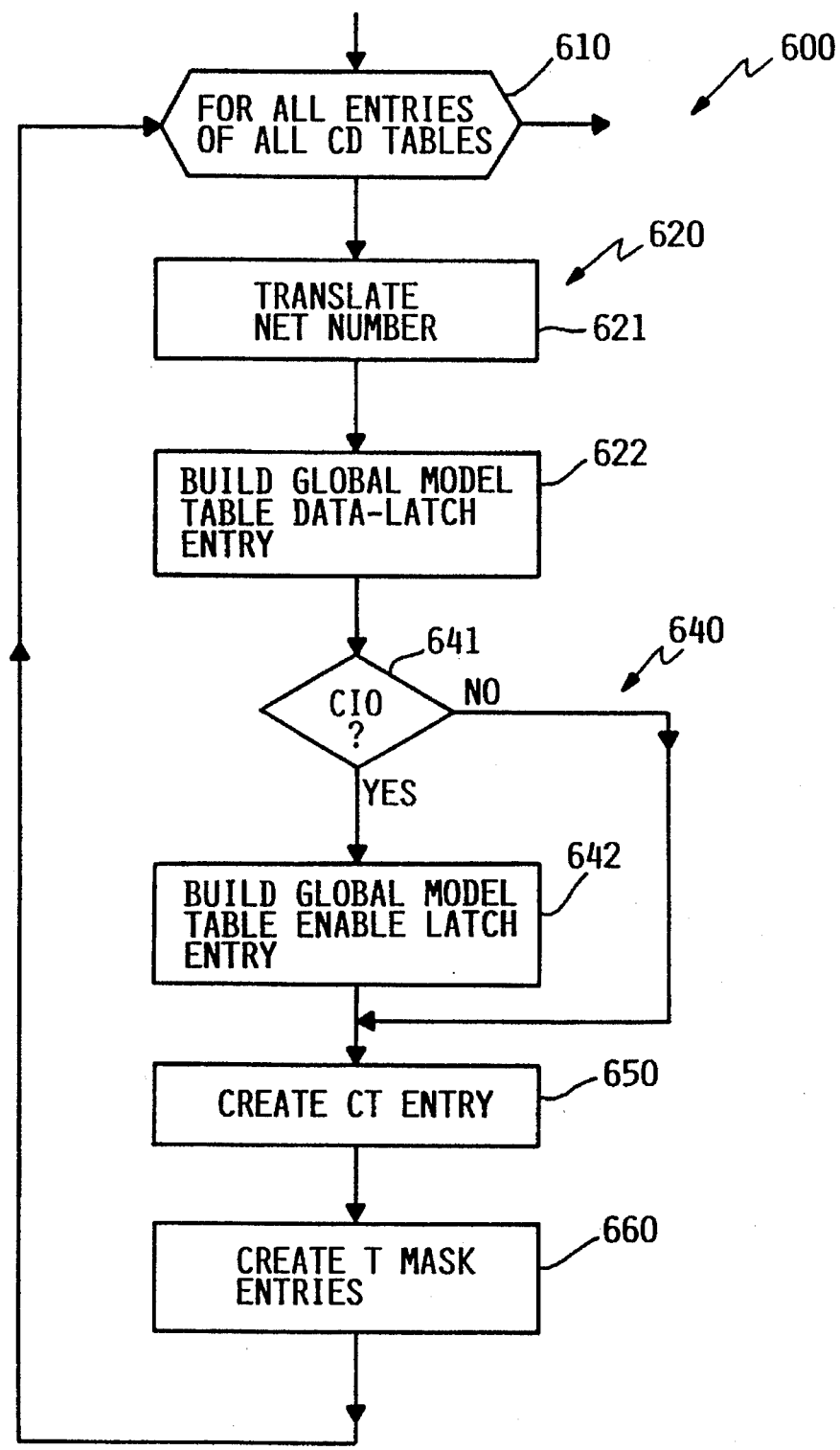
FIG. 6 shows the details of creating a dynamic system configuration within the procedure of FIG. 4.

FIG. 6 shows a procedure 600 which further details step 523.

Figure 7:
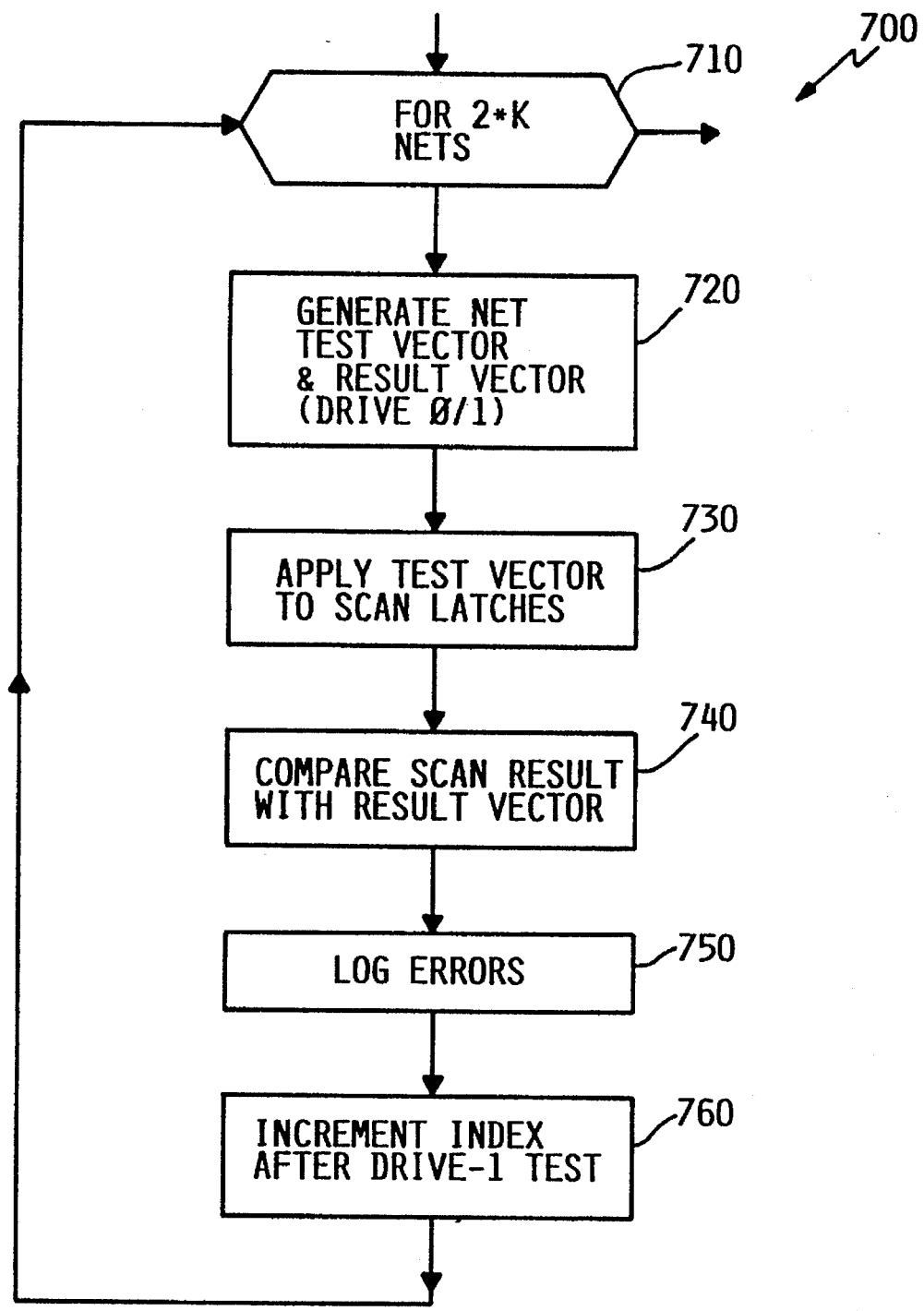
FIG. 7 shows greater detail of the process of conducting the global system-interconnection tests of FIG. 4.

Steps 530 generate and execute the system interconnect tests. Step 531 runs driver-fault tests. These tests verify that each CIO and DO element can effectively drive both one and zero logic values on its respective net, and that each CIO and RO can receive both logic values when driven by every other driver on the net. This test sequence verifies the wiring continuity of all nets, and also the proper functioning of all IO elements and boundary-scan latches. Since driver testing is carried out first, the driver tests are designed to be immune to the presence of shorts between functional nets in the system. FIG. 7 shows details of step 532.

Step 532 logs all driver faults found in step 531, and activates step 533 only if no driver fault has been found in any net tested by step 531.

Step 533 runs tests specifically targeted at detecting and diagnosing shorts between different nets. Shorts testing may employ conventional methodologies; Orosz, "Detection and Diagnosis of Multi-Net Shorts in a Boundary Scan Environment", *IBM Technical Report* 01.A307 (August 1987), shows a suitable technique. Driver testing, step 531, is carried out before shorts testing because faults in driver elements or open faults in net wiring will confound the shorts testing. Note that step 531 catches open nets as well as driver faults, because at least one driver will not be able to drive every receiver to both logic values for any possible open circuit in the net. If any driver faults are discovered in step 531, i.e., the response to query 532 is yes, step 533 is bypassed entirely and failures are diagnosed as in steps 540, especially step 541.

Step 534 logs all shorted faults, and ends procedure 500 with a successful test report 501 to service processor 140 if no faults were encountered. But if faults were encountered, diagnoses of the shorted faults proceeds with steps 540, especially 542.

Fault diagnosis steps 540 are optional, and may be performed in a conventional manner. Step 541 uses the driver-fault log of step 532 to find the location of a stuck driver, failing receiver, or open net wiring in the net for which the fault was recorded. Step 542 performs the same function for shorted-net faults logged by step 534. Both steps 541 and 542 activate step 543 to record the diagnosed failures within the system. Step 543 then aborts procedure 500 with a system-test failure report 502. A test report or indication may assume any of a number of conventional forms, such as an audible warning to an operator, a message display on a terminal or on a service-processor panel, or merely a file in system memory to be accessed at a later time.

FIG. 6 details a procedure 600 which carries out step 523, FIG. 5. Step 610 iterates the procedure for every CD-table entry for the CD tables of all components in the system.

Steps 620 build a GM-table entry for each boundary-scan latch in system 100. Step 621 translates raw net numbers to system-level net numbers, based upon the raw net number and special translation information in the CD-table entry, and the number of the slot into which the system component is plugged. Nets can be divided into three categories: global nets, slot-dependent nets, and special nets. Global nets are a subset of the intercomponent nets 420 that connect in the same way to all slots for a given component type. For example, an address bus may connect to all processors in the system in an identical manner. In the table above, nets 421 and 424 are global nets. These nets require no translation from raw to system level net number, because all system components that connect to them do so in the same way. Typically, most of the type-420 nets are global nets. A small number of type-420 nets may connect differently to different component slots in the system, e.g., to different socket pins in different slots. Such special nets can be translated on a case-by-case basis in software, or system net numbers can be looked up in a special net-mapping table in the CD table. The type-410 nets that do not leave the component can be assigned unique net numbers based upon which component slots which their cards happen to occupy at the moment. Nets 401 and 412 in the example of FIG. 4 are slot-dependent nets. The system net number for these nets may be generated simply by adding a constant based on the current slot to the raw net number from the CDT. For example, if two processor components 121, FIG. 1, are present in the system, the on-component (internal) nets for the second processor must have net numbers different from those of the first processor, even though the connection topology of the two components is identical. This topology is preserved by remapping the on-component net numbers by a constant so they will not overlap with any other net numbers. This net translation strategy requires a compatible assignment of raw net numbers in the CD tables, so the remapping can be accomplished in a simple and inexpensive manner. Raw-net number assignment may give the lowest numbers to global nets, so that remapped on-component net numbers will not overlap the global-net number range. The on-component net mapping constants can be easily chosen so that each slot has a unique net number range large enough to accommodate any component that can be plugged into it.

Step 622 builds a GM-table entry according to the above format, using the translated net number and the information from the CD-table entry for the current IO element. Step 622 produces only the entry for the data latch of an IO element; it does not generate an entry for the enable latch of a CIO element.

Steps 640 process the enable latch of CIO elements. If step 641 detects that the current IO element is a CIO, step 642 creates another GM-table entry for its enable latch, in the same manner as step 622 created its data-latch entry. If the current IO element is not a CIO, as in step 641, the process continues to step 650.

Step 650 increments a connectivity table for the current net in accordance with the type of the current latch. This table can be indexed by system-level net number to obtain the number of CIO, RO, and DO IO elements in any given net; this data is a different representation of some of the data in the GM table.

Step 660 generates a bit mask for each boundary-scan register in the system. This T mask has a bit set for every testable boundary scan latch, and reset for every nontestable latch. Step 650 produces the T mask from the T flag in the component description tables, but it marks all RO latches not driven by any CIOs of DOs in the current system configuration as untestable. The system then reiterates after step 660 to step 610 again for another CD-table entry.

FIG. 7 expands step 531, FIG. 5. The faulty-driver tests allow each driver element (CIO or DO) a chance to drive both logic zero and logic one on the net while all other I/O devices on the net are in receive mode. All nets are tested in parallel, so that exactly one driver is driving every testable net in the system for a given test pattern. In order to mask the effects of possible shorts between different nets, all drivers drive the same logic value on their respective nets in a given test pattern.

Step 710 iterates procedure 700 for every value of a test index i from 1 to K, where K is the maximum number of driver elements in any net of system 100. For each test index, a drive-zeros test pattern is followed by a drive-ones test pattern, so that procedure 700 is performed twice for each value of the test index, for a total of 2K faulty driver tests. Additional tests may be employed to provide a better chance of catching intermittent faults, if desired.

Step 720 generates a faulty-driver test vector for the current test index by visiting each boundary scan latch in the global system model in an arbitrary but fixed order, generating both a test input and an expected output bit for that latch. As boundary-scan latches are visited, step 720 tracks the number of times a CIO or DO has been encountered for each system net. For test index i, the ith CIO element encountered in visiting the boundary-scan latches is configured to drive the appropriate data, i.e., zero for the zeros test, and one for the following ones test, on the net. If i is greater than the number of driver elements on a particular net, then the last driver visited on the net will be given the opportunity to drive the net. Bits in the current test vector are set to provide non-driving CIOs on all nets with data opposite to that being driven by the enabled drivers in the current test vector, and the appropriate bits in the test vector turn off the enable latches of the non-driving drivers. Bits in the test vector cause receive-only latches to undergo a transition upon application of the test. The vector causes all drive-only latches to drive their respective nets. Note that DO elements should only be used on nets with RO elements, since CIOs present on DO nets cannot be fully tested or even functionally employed in system 100. The following table gives test-vector bit values for the inputs and the result vector of expected outputs of driving CIO, non-driving CIO, RO, and DO elements, for both drive-zeros and drive-ones test vectors.

| Test Type | Drive-CIO | | NonDr-CIO | | RO | | DO | |
|---|---|---|---|---|---|---|---|---|
| | in | out | in | out | in | out | in | out |
| ZEROS | 01 | 01 | 10 | 00 | 1 | 0 | 0 | 0 |
| ONES | 11 | 11 | 00 | 10 | 0 | 1 | 1 | 1 |

In the preferred embodiment, no distinction is made between type-410 and type-420 nets, that is, all nets in the entire system, both on-card and off-card, are tested seamlessly and in parallel.

Step 730 applies the input test pattern generated in step 720 to system 100. First, service processor 140 raises the driver-inhibit signal 356, FIG. 3, to all system components. This prevents driver elements from driving arbitrary data onto nets as test data is serially shifted through their boundary-scan latches via line 353. When the test-vector data has been scanned into all latches, driver inhibit 356 is dropped, allowing the test-vector data values to propagate onto the nets. After sufficient time has elapsed to allow all net logic values to settle, boundary-scan clocks 354 are cycled. This samples the state of all nets in the system into the CIO and RO data latches. Service processor 140 then raises driver inhibit signal 356 again, and scans result data out serially from all boundary-scan latches, via result line 355, to service processor 140.

Step 740 compares the scanned-out results with the expected output data generated in step 730. This comparison may be accomplished with simple logical operations. First, the scanned-out data is EXCLUSIVE-ORed with the expected output data. Then the result is ANDed with the test mask which had been generated in procedure 600, FIG. 6. If any bit is set in this final result, then an interconnect test failure has occurred on a testable net. In this case, step 750 logs the error. Error logging saves all relevant failure information, such as: failing card, failing chip, failing latch, failing test index which can be used to determine what driver was in control during the current test, failing latch type, and fault-tolerance information. All errors for all failing latch positions are logged for any test pattern that fails. The error log may optionally be passed to a diagnostic routine that attempts to determine the underlying causes of the logged errors.

Finally, step 760 iterates to the next test index i if the current test was a drive-ones test.

Modifications and extensions within the spirit and scope of the present invention will appear to those skilled in the art. Having described a preferred embodiment thereof, we claim as our invention:

1. A method for dynamically testing an interconnection structure among components in a variable configuration of an electronics system, said method comprising:

(a) initiating a system interconnect test at a certain time;

(b) substantially at said certain time, reading component data stored within said system, said component data including product type and interconnect structure description of each of said components within said system;

(c) constructing from said component data a global model specifying said interconnection structure existing within said system at said certain time;

(d) creating from said global model a set of test data and expected result data for checking said interconnection structure;

(e) applying said test data to said components to produce actual result data representing the condition of said interconnection structure;

(f) comparing said actual result data with said expected result data;

(g) diagnosing a failure in said interconnection structure if said actual result data differs from said expected result data.

2. The method of claim 1, wherein wherein said interconnection structure comprise a plurality of nets further comprising a plurality of on-card nets and a plurality of system-level nets, said interconnections between said nets each having a plurality of latches.

3. The method of claim 2, wherein said product type data identifies said each card as belonging to one of a small number of types.

4. The method of claim 3, further comprising the step of accessing one of a number of component-description tables for said each component as specified by said product data, and wherein step (c) constructs said global model from data contained in said accessed component-description tables.

5. The method of claim 1, wherein step (e) comprises transmitting said test data to certain of said latches and receiving said actual result data from others of said latches.

6. The method of claim 5, wherein step (f) detects short circuits between different ones of said nets.

7. The method of claim 5, wherein step (f) detects failing latches in said nets.

8. The method of claim 7, wherein step (f) detects open circuits in said nets.

9. The method of claim 5, wherein said test data is transmitted to one latch in each of said nets, and wherein said actual result data is received from all other latches in said each net.

10. The method of claim 9, wherein said test data includes multiple data levels for said one latch.

11. The method of claim 9, wherein said certain of said latches include drivers, receivers, or driver/receivers, and wherein step (e) is repeated for each latch in said nets having a driver or a driver/receiver.

12. The method of claim 11, wherein certain of said latches are enable latches for other latches which include driver/receivers, and wherein said test data includes data for designating whether individual ones of said driver/receiver latches drive said test data onto their respective net or receive actual result data from such net.

13. An electronics system, comprising:
   (a) an interconnect structure having a plurality of locations, and further including functional wiring and test wiring coupling said locations to each other;
   (b) a plurality of components removably connected to said interconnect-structure locations in a variable configuration, each of said components having associated product type data and interconnect structure descriptions stored in said system for identifying how said each component couples to said functional wiring, and further including a set of latches coupled both to said functional wiring and to said test wiring, the latches of different components coupled together through said functional wiring defining a set of variable nets;
   (c) a service processor coupled to said interconnect structure and having means for constructing a global model of said nets from said product type data and said interconnect structure descriptions, means for generating test vectors and expected result vectors conforming to said global model, means for applying said test vectors to said latches and for receiving actual result vectors via said test wiring, and means for comparing said actual result vector with said expected result vector to produce a test report.

14. The system of claim 13, wherein each of said components includes storage means for holding said product type data and said interconnect structure descriptions associated with that component.

15. The system of claim 14, wherein said interconnect structure further comprises on-board nets and system level nets connected to a bus having a plurality of sockets for receiving said components.

16. The system of claim 15, wherein said components are boards and chips on said boards with said boards having plugs for coupling to said sockets.

17. The system of claim 13, wherein said latches are scan latches having a normal mode for transferring data between said components and said functional wiring, and having a test mode for transferring said test vectors and said actual result vectors between said latches and said service processor via said test wiring.

18. The system of claim 17, wherein said test wiring couples said latches in a scan ring, and wherein said service processor shifts said test vectors and said actual result vectors serially through said scan ring.

19. The system of claim 18, wherein said test wiring includes a scan clock for shifting said vectors through said scan ring.

* * * * *